United States Patent
Hirose et al.

(10) Patent No.: US 12,414,388 B2
(45) Date of Patent: Sep. 9, 2025

(54) EPITAXIAL SILICON WAFER, METHOD FOR PRODUCING SAME, AND METHOD FOR PRODUCING SEMICONDUCTOR DEVICE

(71) Applicant: SUMCO CORPORATION, Tokyo (JP)

(72) Inventors: Ryo Hirose, Tokyo (JP); Takeshi Kadono, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 429 days.

(21) Appl. No.: 18/041,930

(22) PCT Filed: Jul. 8, 2021

(86) PCT No.: PCT/JP2021/025864
§ 371 (c)(1),
(2) Date: Feb. 16, 2023

(87) PCT Pub. No.: WO2022/044562
PCT Pub. Date: Mar. 3, 2022

(65) Prior Publication Data
US 2023/0317761 A1    Oct. 5, 2023

(30) Foreign Application Priority Data
Aug. 26, 2020 (JP) .................. 2020-142329

(51) Int. Cl.
*H01L 27/146* (2006.01)
*C30B 25/18* (2006.01)
(Continued)

(52) U.S. Cl.
CPC ......... *H10F 39/028* (2025.01); *C30B 25/186* (2013.01); *C30B 25/20* (2013.01);
(Continued)

(58) Field of Classification Search
CPC ....... C30B 25/20; C30B 25/186; C30B 29/06; C30B 31/22; H01L 21/02381;
(Continued)

(56) References Cited

U.S. PATENT DOCUMENTS

| 9,117,676 B2 * | 8/2015 | Kadono ............... H10D 62/834 |
| 2014/0080247 A1 | 3/2014 | Kadono et al. |
| 2016/0315117 A1 | 10/2016 | Okuyama |

FOREIGN PATENT DOCUMENTS

| DE | 112013005407 T5 | 7/2015 |
| JP | 2009-540536 A | 11/2009 |

(Continued)

OTHER PUBLICATIONS

ISR for PCT/JP2021/025864, dated Sep. 7, 2021 (w/ translation).
(Continued)

*Primary Examiner* — Jaehwan Oh
(74) *Attorney, Agent, or Firm* — Greenblum & Bernstein, P.L.C.

(57) ABSTRACT

A method of producing an epitaxial silicon wafer includes irradiating a surface of a silicon wafer with a beam of cluster ions containing $SiH_x$ ions (at least one of the integers 1 to 3 is selected as x of the $SiH_x$ ions) and $C_2H_y$ ions (at least one of the integers 2 to 5 is selected as y of the $C_2H_y$ ions) to form a modified layer that is located in a surface layer portion of the silicon wafer and that contains as a solid solution of the constituent elements of the cluster ion beam, and further includes forming a silicon epitaxial layer on the modified layer of the silicon wafer. The dose of the $SiH_x$ ions is $1.5 \times 10^{14}$ ions/cm$^2$ or more.

8 Claims, 8 Drawing Sheets

(51) Int. Cl.
  *C30B 25/20* (2006.01)
  *C30B 29/06* (2006.01)
  *C30B 31/22* (2006.01)
  *H10F 39/00* (2025.01)
  *H10F 39/12* (2025.01)

(52) U.S. Cl.
  CPC .............. *C30B 29/06* (2013.01); *C30B 31/22* (2013.01); *H10F 39/199* (2025.01)

(58) Field of Classification Search
  CPC ......... H01L 21/02631; H01L 21/02658; H01L 21/26566; H01L 21/3221
  See application file for complete search history.

(56) References Cited

FOREIGN PATENT DOCUMENTS

| | | |
|---|---|---|
| JP | 2010-283022 A | 12/2010 |
| JP | 2017-112339 A | 6/2017 |
| KR | 10-2017-0026669 A | 3/2017 |
| WO | WO 2012/157162 A1 | 11/2012 |
| WO | WO 2015/104965 A1 | 7/2015 |

OTHER PUBLICATIONS

Written Opinion for PCT/JP2021/025864, dated Sep. 7, 2021 (w/ translation).
Office Action for KR App. No. 10-2023-7004419, dated Mar. 19, 2024 (w/ translation).
Office Action for DE App. No. 11 2021 004 491.5, dated Apr. 30, 2025 (w/ translation).

* cited by examiner

EPITAXIAL SILICON WAFER, METHOD FOR PRODUCING SAME, AND METHOD FOR PRODUCING SEMICONDUCTOR DEVICE

TECHNICAL FIELD

This disclosure relates to an epitaxial silicon wafer, a method of producing an epitaxial silicon wafer, and a method of producing a semiconductor device.

BACKGROUND

Epitaxial silicon wafers in which an epitaxial layer of a single crystal silicon is formed on a silicon wafer are used as device substrates for producing various semiconductor devices such as metal oxide semiconductor field-effect transistors (MOSFETs), dynamic random access memories (DRAMs), power transistors, and back side illuminated (BSI) CMOS image sensors (CISs).

Now, when an epitaxial layer in a CIS is contaminated with a heavy metal, dark current increases, which degrades the characteristics of a semiconductor device to be obtained, for example, results in the formation of defects called white spot defects. To inhibit such heavy metal contamination, techniques of forming a gettering site in a silicon wafer for trapping heavy metals are used. A known method is implanting ions in a silicon wafer and then forming an epitaxial layer. In this method, a region to which the ions are implanted serves as a gettering site.

WO 2012/157162 A (PTL 1) and WO 2015/104965 A (PTL 2) each describe an epitaxial silicon wafer production method including: a step of irradiating a surface of a silicon wafer with cluster ions having constituent elements of carbon and hydrogen, such as $C_3H_5$, to form a modified layer that is located in a surface part of the silicon wafer and that includes the constituent elements of the cluster ions in solid solution; and a step of forming an epitaxial layer on the modified layer of the silicon wafer.

PTL 1 demonstrates that a modified layer formed by irradiation with cluster ions having the constituent elements of carbon and hydrogen can have higher gettering capability than an ion implantation region formed by the implantation of carbon monomer ions.

PTL 2 describes an improved technique of the technique described in PTL 1, in which irradiation with a high dose of cluster ions including the constituent elements of carbon and hydrogen is performed so that a part of the modified layer in the thickness direction forms an amorphous layer, thereby improving the gettering capability for heavy metals. Further, PTL 2 discusses that when performing irradiation with such a high dose of cluster ions, minute black spot defects caused due to implanted carbon for example are visually observed in a cross-sectional TEM image of a modified layer after epitaxial growth, and the black spot defects would contribute to the improvement of gettering capability.

CITATION LIST

Patent Literature

PTL 1: WO 2012/157162 A
PTL 2: WO 2015/104965 A

SUMMARY

Technical Problem

In the technique of irradiation with cluster ions including carbon and hydrogen as in PTL 1 and PTL 2, increasing the dose of cluster ions is effective in enhancing the gettering capability of the modified layer. However, according to the studies made by the present inventors, epitaxial silicon wafers made with a high dose of carbon are found to deteriorate in electrical properties when the thickness of an epitaxial layer is as thin as 4 μm or less especially when used in for example BSI CISs. The cause for the deterioration is presumably that in the case of a high dose of carbon, carbon present at a high concentration in the modified layer diffuses into the silicon epitaxial layer during the epitaxial growth and during the device formation process, and point defects caused due to carbon are formed in the silicon epitaxial layer. Particularly when the epitaxial layer is thin, point defects caused due to carbon are to be formed in a device formation region in the epitaxial layer.

Note however that when the dose of carbon in the form of cluster ions is reduced in order to reduce the point defects formed due to carbon, sufficient heavy metal gettering capability cannot be obtained. Accordingly, obtaining high gettering capability and inhibiting the diffusion of carbon into the epitaxial layer during the epitaxial growth and during the device formation process cannot both be achieved by the conventional technique of irradiation with cluster ions including carbon and hydrogen.

In view of the above problems, it could be helpful to provide a method of producing an epitaxial silicon wafer in which sufficient getting capability is secured and the diffusion of carbon into an epitaxial layer is inhibited during the epitaxial growth and during the device formation process.

Further, it could be helpful to provide an epitaxial silicon wafer in which sufficient gettering capability is secured and the diffusion of carbon into an epitaxial layer is inhibited during the epitaxial growth and during the device formation process.

Solution to Problem

The present inventors made diligent studies to solve the above problems and found the following. When irradiation with a low dose of carbon is performed using cluster ions including carbon and hydrogen, although the diffusion of carbon into the epitaxial layer can be inhibited, the getting capability is insufficient. To address this, with a view to compensating for the reduction of getting capability due to the low dose of carbon, the present inventors contemplated performing irradiation with cluster ions including constituent elements other than carbon while performing the irradiation with cluster ions including carbon and hydrogen.

They then found that even if the dose of carbon is low, sufficient gettering capability can be obtained by irradiating a surface of a silicon wafer with $C_2H_y$ ions (y may take different values for different ions and at least one of the integers 2 to 5 is selected as y of the $C_2H_y$ ions) and a predetermined dose of $SiH_x$ ions (x may take different values for different ions and at least one of the integers 1 to 3 is selected as x of the $SiH_x$ ions) at the same time.

Here, Si derived from $SiH_x$ ions implanted to the surface layer portion of the silicon wafer is hardly distinguished from Si constituting the silicon wafer. However, the present inventors succeeded in indirectly ascertaining the favorable effects of Si implantation by analysis using secondary ion mass spectrometry (SIMS) and observation using a transmission electron microscope (TEM).

First, the epitaxial silicon wafer made in this way has a low quantity of carbon distributed in the silicon epitaxial layer and in the modified layer due to the low dose of carbon. However, in the cross-sectional TEM image of the modified layer, EOR defects having a maximum width of 50 nm to 250 nm are found visually. These defects are conjectured to be defects caused by the implantation of $SiH_x$ ions unlike black spot defects caused by carbon implantation.

Further, for the epitaxial silicon wafer made in this way, in the SIMS carbon concentration profile in the depth direction of the modified layer, a sharp peak appears at a position in the modified layer near the interface between the modified layer and the epitaxial layer even in the case of a low dose of carbon, and a peak is also found in the SIMS hydrogen concentration profile in the depth direction of the modified layer.

This disclosure completed based on the above findings primarily includes the following features.

[1] A method of producing an epitaxial silicon wafer, the method comprising:
  a step of irradiating a surface of a silicon wafer with a cluster ion beam including $SiH_x$ ions and $C_2H_y$ ions to form a modified layer that is located in a surface layer portion of the silicon wafer and that contains a solid solution of constituent elements of the cluster ion beam, where at least one of the integers 1 to 3 is selected as x of the $SiH_x$ ions, and at least one of the integers 2 to 5 is selected as y of the $C_2H_y$ ions; and
  a step of forming a silicon epitaxial layer on the modified layer of the silicon wafer,
  wherein a dose of the $SiH_x$ ions is $1.5 \times 10^{14}$ ions/cm² or more.

[2] The method of producing an epitaxial silicon wafer, according to [1] above, wherein a dose of the $C_2H_y$ ions is $1.0 \times 10^{14}$ ions/cm² or less.

[3] The method of producing an epitaxial silicon wafer, according to [1] or [2] above, wherein a source gas of the cluster ion beam is diethylsilane.

[4] The method of producing an epitaxial silicon wafer, according to any one of [1] to [3] above, wherein for the cluster ion beam, each of 1, 2, and 3 is selected as x of the $SiH_x$ ions, and 5 is selected as y of the $C_2H_y$ ions.

[5] The method of producing an epitaxial silicon wafer, according to any one of [1] to [4] above, wherein a thickness of the silicon epitaxial layer is 4 μm or less.

[6] An epitaxial silicon wafer comprising:
  a silicon wafer;
  a modified layer that is located in a surface layer portion of the silicon wafer and that contains a solid solution of at least one of carbon and hydrogen; and
  a silicon epitaxial layer formed on the modified layer,
  wherein in a defect analysis using a cross-sectional TEM image of the modified layer, a defect region in which EOR defects having a maximum width of 50 nm to 250 nm are present at a density of $5.0 \times 10^7$/cm² or more is observed,
  an amount of carbon distributed in the silicon epitaxial layer and the modified layer is $2.0 \times 10^{14}$ atoms/cm² or less, and
  in a hydrogen concentration profile in a depth direction of the modified layer, found by SIMS, a peak concentration is $1.0 \times 10^{16}$ atoms/cm³ or more.

[7] A method of producing a semiconductor device, the method comprising: the steps of the method of producing an epitaxial silicon wafer, according to any one of [1] to [5] above; and
  a step of forming a semiconductor device in the silicon epitaxial layer of the epitaxial silicon wafer.

[8] The method of producing a semiconductor device, the method comprising a step of forming a semiconductor device in the silicon epitaxial layer of the epitaxial silicon wafer according to [6] above.

Advantageous Effect

The method of producing an epitaxial silicon wafer, according to this disclosure can produce an epitaxial silicon wafer in which sufficient getting capability is secured and the diffusion of carbon into an epitaxial layer is inhibited during the epitaxial growth and during the device formation process.

For the epitaxial silicon wafer according to this disclosure, sufficient getting capability is secured and the diffusion of carbon into an epitaxial layer is inhibited during the epitaxial growth and during the device formation process.

DETAILED DESCRIPTION

Embodiments of a method of producing a silicon epitaxial wafer, according to this disclosure will now be described in detail with reference to the drawings. Note that in FIG. 1, the thicknesses of a modified layer 14 and a silicon epitaxial layer 16 are exaggerated relative to the thickness of a silicon wafer 10 for convenience of description and thus the ratio of the thicknesses differs from the actual ratio.

(Method of Producing Epitaxial Silicon Wafer)

Figure 1:
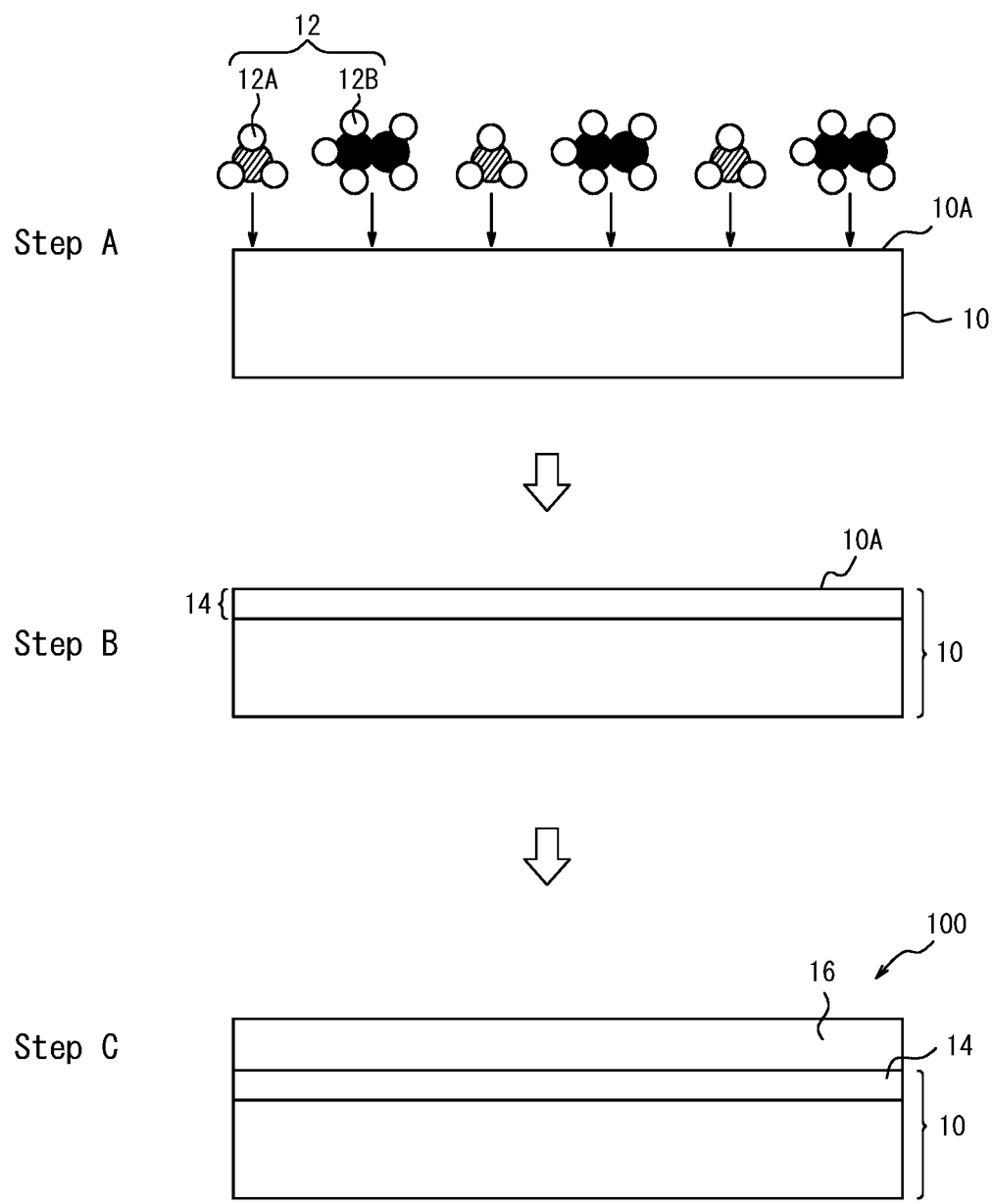
FIG. 1 presents cross-sectional views schematically illustrating steps of a method of producing an epitaxial silicon wafer 100, according to one embodiment of this disclosure.

A method of producing an epitaxial silicon wafer 100, according to one embodiment of this disclosure has, as illustrated in FIG. 1, a first step of irradiating a surface 10A of a silicon wafer 10 with a beam of cluster ions 12 containing $SiH_x$ ions 12A (x may take different values for different ions and at least one of the integers 1 to 3 is selected as x of the $SiH_x$ ions) and $C_2H_y$ ions 12B (y may take different values for different ions and at least one of the integers 2 to 5 is selected as y of the $C_2H_y$ ions) to form a modified layer 14 that is located in a surface layer portion of the silicon wafer 10 and that contains a solid solution of the constituent elements of the cluster ion beam (steps A and B in FIG. 1), and a second step of forming a silicon epitaxial layer 16 on the modified layer 14 of the silicon wafer 10

(step C in FIG. 1). The silicon epitaxial layer 16 forms a device layer for producing a semiconductor device such as a BSI CIS.

[First Step]

Examples of the silicon wafer 10 include a bulk single crystal silicon wafer which does not have an epitaxial layer on its surface. Further, carbon and/or nitrogen may be added to the silicon wafer to achieve higher gettering capability. Moreover, a given dopant may be added to the silicon wafer at a predetermined concentration to obtain an n+ type, p+ type, n− type, or p− type substrate.

Alternatively, an epitaxial silicon wafer in which a silicon epitaxial layer is formed on a surface of a bulk single crystal silicon wafer may be used as the silicon wafer 10. The silicon epitaxial layer can be formed by CVD under typical conditions. The thickness of the epitaxial layer is preferably in the range of 0.1 µm to 10 µm, more preferably in the range of 0.2 µm to 5 µm, In the first step, the surface 10A of the silicon wafer 10 is irradiated with the beam of the cluster ions 12 containing the ions 12A of $SiH_x$ (x may take different values for different ions and at least one of the integers 1 to 3 is selected as x of the $SiH_x$ ions) and the ions 12B of $C_2H_y$ (y may take different values for different ions and at least one of the integers 2 to 5 is selected as y of the $C_2H_y$ ions). In this specification, "cluster ions" are obtained by bombarding gaseous molecules with electrons to dissociate the bond of the gaseous molecules by electron impact ionization thereby forming aggregates of atoms having different numbers of atoms; ionizing the aggregates of atoms by causing fragmentation; subjecting the aggregates of atoms having different numbers of atoms having been ionized to mass separation; and extracting the ionized aggregates of atoms having certain mass numbers. Specifically, the "cluster ions" herein are obtained by ionization of clusters by giving positive charges or negative charges to the clusters formed by the aggregation of a plurality of atoms, and such cluster ions are clearly distinguished from monoatomic ions such as carbon ions and monomolecular ions such as carbon monoxide ions. The number of atoms constituting the cluster ions is usually around 5 to 100. As a cluster ion implanting system using such a theory, for example, CLARIS (a registered trademark in Japan, other countries, or both) manufactured by Nissin Ion Equipment Co., Ltd. can be used.

When the silicon wafer 10 is irradiated with a beam of the cluster ions 12 containing the $SiH_x$ ions 12A and the $C_2H_y$ ions 12B, the irradiation energy instantaneously heats silicon in the surface layer portion of the silicon wafer 10 to a high temperature of around 1350° C. to 1400° C. and thus the silicon melts. After that, the silicon is rapidly cooled, thus carbon, hydrogen, and silicon from the cluster ions 12 dissolve in solid solution in the surface layer portion of the silicon wafer. Accordingly, the "modified layer" herein means a layer in which at least one of carbon, hydrogen, and silicon that are the constituent elements of the cluster ions to be shot form a solid solution at crystal interstitial sites or substitutional sites in the crystal lattice sites of the surface layer portion of the silicon wafer. Note however that Si derived from $SiH_x$ ions implanted to the surface layer portion of the silicon wafer is hardly distinguished from Si constituting the silicon wafer. Accordingly, the "modified layer" herein is defined as an area in which either of the elements is detected at a higher concentration than the background in the SIMS concentration profiles of carbon and hydrogen in the depth direction of the silicon wafer. During the stage after the implantation of the cluster ions and before the formation of the epitaxial layer, in most cases, a surface layer portion of 500 nm or less from the surface of the silicon wafer forms the modified layer. During the stage after the formation of the epitaxial layer, since carbon diffuses from the surface of the silicon wafer into the inside, a surface layer portion of around 2 µm to 4 µm from the surface of the silicon wafer (the interface between the epitaxial layer and the silicon wafer) forms the modified layer.

Although the details will be described based on the experimental results in Examples, in this embodiment, it is important to use the cluster ions 12 containing $SiH_x$ ions 12A and $C_2H_y$ ions 12B. Here, x may take different values for different ions and at least one of the integers 1 to 3 is selected as x of the $SiH_x$ ions; specifically, the $SiH_x$ ions 12A contain one or more species of ions selected from SiH ions, $SiH_2$ ions, and $SiH_3$ ions. Further, y may take different values for different ions and at least one of the integers 2 to 5 is selected as y of the $C_2H_y$ ions; specifically, the $C_2H_y$ ions 12B contain one or more species of ions selected from $C_2H_2$ ions, $C_2H_3$ ions, $C_2H_4$ ions, and $C_2H_5$ ions. Thus, for the epitaxial silicon wafer 100 to be obtained later, sufficient gettering capability is secured and the diffusion of carbon into an epitaxial layer can be inhibited during the epitaxial growth and during the device formation process. This can inhibit the formation of point defects caused due to carbon, in the device formation region in the epitaxial layer 16.

The present inventors believe that the mechanism allowing for such an effect is as follows; however, this disclosure is not limited to this. Since a silicon atom has a larger mass number than a carbon atom, irradiation with $SiH_x$ ions causes great damage (implantation defects) to the surface layer portion of the silicon wafer, which presumably contributes to high gettering capability. Specifically, relatively large implantation defects are formed in the modified layer 14 due to the implantation of $SiH_x$ ions. Further, the implanted carbon derived from $C_2H_y$ ions aggregates in the implantation defects and hydrogen is also trapped there, thus a region of defects (EOR defects) that can have high getting capability is presumably formed.

Gaseous molecules as a source of the cluster ions are not limited as long as $SiH_x$ ions (at least one of the integers 1 to 3 is selected as x of the $SiH_x$ ions) and $C_2H_y$ ions (at least one of the integers 2 to 5 is selected as y of the $C_2H_y$ ions) can be formed at the same time. Examples of the gaseous molecules include diethylsilane ($SiC_4H_{12}$), butylsilane ($SiC_4H_{12}$), methylpropylsilane ($SiC_4H_{12}$), pentylsilane ($SiC_5H_{14}$), methylbutylsilane ($SiC_5H_{14}$), and ethylpropylsilane ($SiC_5H_{14}$). Note that cluster ions having different sizes can be produced from these respective source gases. For example, as given in FIG. 2 and Table 1, from diethylsilane ($SiC_4H_{12}$); $C_2H_2$ ions, $C_2H_3$ ions, $C_2H_4$ ions, and $C_2H_5$ ions are derived as $C_2H_y$ ions having a mass number in the range of 26 to 31; and SiH ions, $SiH_2$ ions, and $SiH_3$ ions are derived as $SiH_x$ ions having a mass number in the range of 26 to 31. Accordingly, diethylsilane is most suitable for the source gas used in this embodiment. Cluster ions (fragments) having a mass number in the desired range are extracted, thus a cluster ion beam of the desired ion species can be generated. For example, when fragments having a mass number of 29 to 31 are extracted; a cluster ion beam containing $SiH_3$ ions, $SiH_2$ ions, and SiH ions as $SiH_x$ ions; and $C_2H_5$ ions as $C_2H_y$ ions can be generated.

The total dose of cluster ions can be adjusted by controlling the ion irradiation time as a system setting value. In this embodiment, the total dose is preferably set so that the dose of $SiH_x$ ions and the dose of $C_2H_y$ ions satisfy the following ranges.

It is important that the dose of SiH ions is set to $1.5×10^{14}$ ions/cm² or more. When the dose is less than $1.5×10^{14}$ ions/cm², the effect of implanting $SiH_x$ ions according to this disclosure cannot be fully achieved. Further, in terms of more satisfactorily achieving the effect of this disclosure, the dose is preferably $3.0×10^{14}$ ions/cm² or more. On the other hand, when the dose is excessively high, the silicon wafer is excessively damaged by ion implantation, and defects are formed in the epitaxial layer after the formation of the epitaxial layer. Therefore, the dose is preferably $1.0×10^{15}$ ions/cm² or less.

The dose of $C_2H_y$ ions is preferably $1.0×10^{14}$ ions/cm² or less. This can reduce the amount of carbon to be implanted and can inhibit the diffusion of carbon into the epitaxial layer during the epitaxial growth and during the device formation process. From this perspective, the dose is more preferably $5.0×10^{13}$ ions/cm² or less. On the other hand, in terms of securing sufficient gettering capability, the dose is preferably $1.0×10^{13}$ ions/cm² or more.

Figure 4:
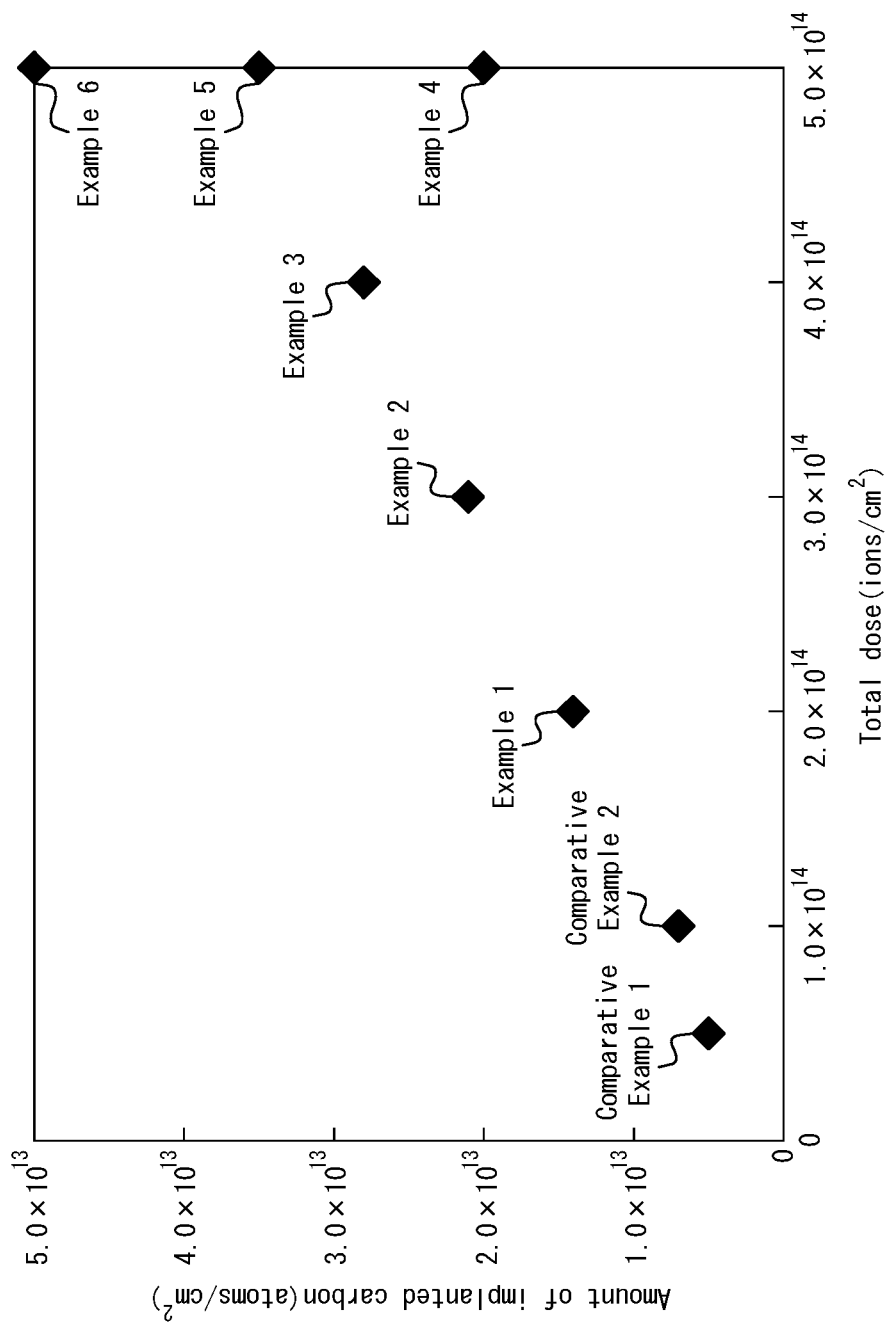
FIG. 4 is a graph illustrating the relationship between the total dose and the amount of implanted carbon, found in Examples 1 to 6 and Comparative Examples 1 and 2.

Further, the total dose can be determined as a system setting value. However, the dose of the $C_2H_y$ ions and the dose of the $SiH_x$ ions cannot be determined separately, thus they are determined in the following manner. For the silicon wafer having been irradiated with cluster ions, the carbon concentration profile in the depth direction of the silicon wafer from the surface is determined by SIMS measurement, and the amount of carbon implanted into the modified layer is found from the carbon concentration profile. Since the number of carbon atoms in an $C_2H_y$ ion is 2, the value obtained by dividing the amount of implanted carbon found as described above by 2 can be identified as "the dose of $C_2H_y$ ions". Further, "the dose of $SiH_x$ ions" can be determined by subtracting the dose of $C_2H_y$ ions found as described above from the total dose. Further, the ratios of the dose of $C_2H_y$ ions and the dose of $SiH_x$ ions to the total dose can be controlled by changing the conditions of an ion implantation system, such as the precision of a mass separation device that separates ions, the setting values of the mass number of ions to be implanted, the amount of the source gas to be introduced, and the energy of electrons to be shot for ionization; and cluster ions having the same ratios can be formed as long as those conditions are not changed (see Comparative Example 2 and Examples 1 to 3, and 5 in FIG. 4).

The acceleration voltage for the cluster ions, in combination with the ion species, influences the peak position in the concentration profile of the constituent elements in the depth direction in the modified layer. In this embodiment, the acceleration voltage for the cluster ions can be set to higher than 0 keV/ion and lower than 200 keV/ion, is preferably set to 100 keV/ion or lower, and is more preferably set to 80 keV/ion or lower. The acceleration voltage is typically controlled using two methods: (1) electrostatic acceleration and (2) radiofrequency acceleration. Examples of the former method include a method in which a plurality of electrodes are arranged at regular intervals, and the same voltage is applied between the electrodes, thereby forming a constant acceleration field in the axial direction. Examples of the latter method include a linear accelerator (linac) method in which ions are caused to travel along a straight line while being accelerated by radio waves.

The beam current of the cluster ions can be appropriately determined for example within a range of 50 μA to 5000 μA, but not limited thereto. The beam current of the cluster ions can be adjusted for example by changing the conditions for the decomposition of the source gas in the ion source.

[Second Step]

The silicon epitaxial layer 16 can be formed under typical conditions. For example, a source gas such as dichlorosilane or trichlorosilane can be introduced into a chamber using hydrogen as a carrier gas, and the source material can be epitaxially grown on the modified layer 14 of the silicon wafer 10 by CVD at a temperature in a range of approximately 1000° C. to 1200° C., although the growth temperature also depends on the source gas to be used. The silicon epitaxial layer 16 preferably has a thickness in a range of 1 μm to 15 μm. When the thickness is less than 1 μm, the resistivity of the silicon epitaxial layer 16 would change due to the out-diffusion of dopants from the silicon wafer 10, whereas a thickness exceeding 15 μm would affect the spectral sensitivity characteristics of CISs. However, in this embodiment, the thickness of the silicon epitaxial layer 16 is preferably 4 μm or less. In this case, the effect of this disclosure can be advantageously achieved.

The production method of this embodiment, described above can produce an epitaxial silicon wafer in which sufficient gettering capability is secured and the diffusion of carbon into an epitaxial layer is inhibited during the epitaxial growth and during the device formation process.

After the first step before the second step, recovery heat treatment for crystallinity recovery may be performed on the silicon wafer 10. For recovery heat treatment in this case, the silicon wafer 10 may be maintained in an atmosphere of for example nitrogen gas or argon gas at a temperature of 900° C. or higher and 1100° C. or lower for 10 min or more and 60 min or less. Further, the recovery heat treatment may be performed using a rapid heating/cooling apparatus for rapid thermal annealing (RTA), rapid thermal oxidation (RTO), or the like, separate from an epitaxial growth apparatus.

(Epitaxial Silicon Wafer)

Referring to FIG. 1, the epitaxial silicon wafer 100 of one embodiment of this disclosure can be obtained by the above production method, and includes: a silicon wafer 10; a modified layer 14 that is formed in a surface layer portion of the silicon wafer 10 and is a solid solution of at least one of carbon and hydrogen; and a silicon epitaxial layer 16 formed on the modified layer 14.

[SIMS Profile]

It is important that the amount of carbon distributed in the silicon epitaxial layer 16 and the modified layer 14 is $2.0×10^{14}$ atoms/cm² or less in the epitaxial silicon wafer 100. This can reduce the amount of carbon to be implanted and can inhibit the diffusion of carbon into the epitaxial layer during the epitaxial growth and during the device formation process. From this perspective, the amount of carbon is more preferably $1.0×10^{14}$ atoms/cm² or less. On the other hand, in terms of securing sufficient gettering capability, the amount of carbon is preferably $2.0×10^{13}$ atoms/cm² or more. Further, in this disclosure, "the amount of carbon" can be determined for an epitaxial silicon wafer by finding the carbon concentration profile (FIG. 5) in the depth direction from the surface of the silicon epitaxial layer by SIMS measurement and integrating the carbon concentration profile in the range from the surface of the epitaxial layer to the end of the modified layer (i.e. the position where the carbon concentration profile of the silicon wafer is flat) on the horizontal axis (i.e. the depth direction), where the carbon concentration is higher than the background on the vertical axis.

Figure 5:
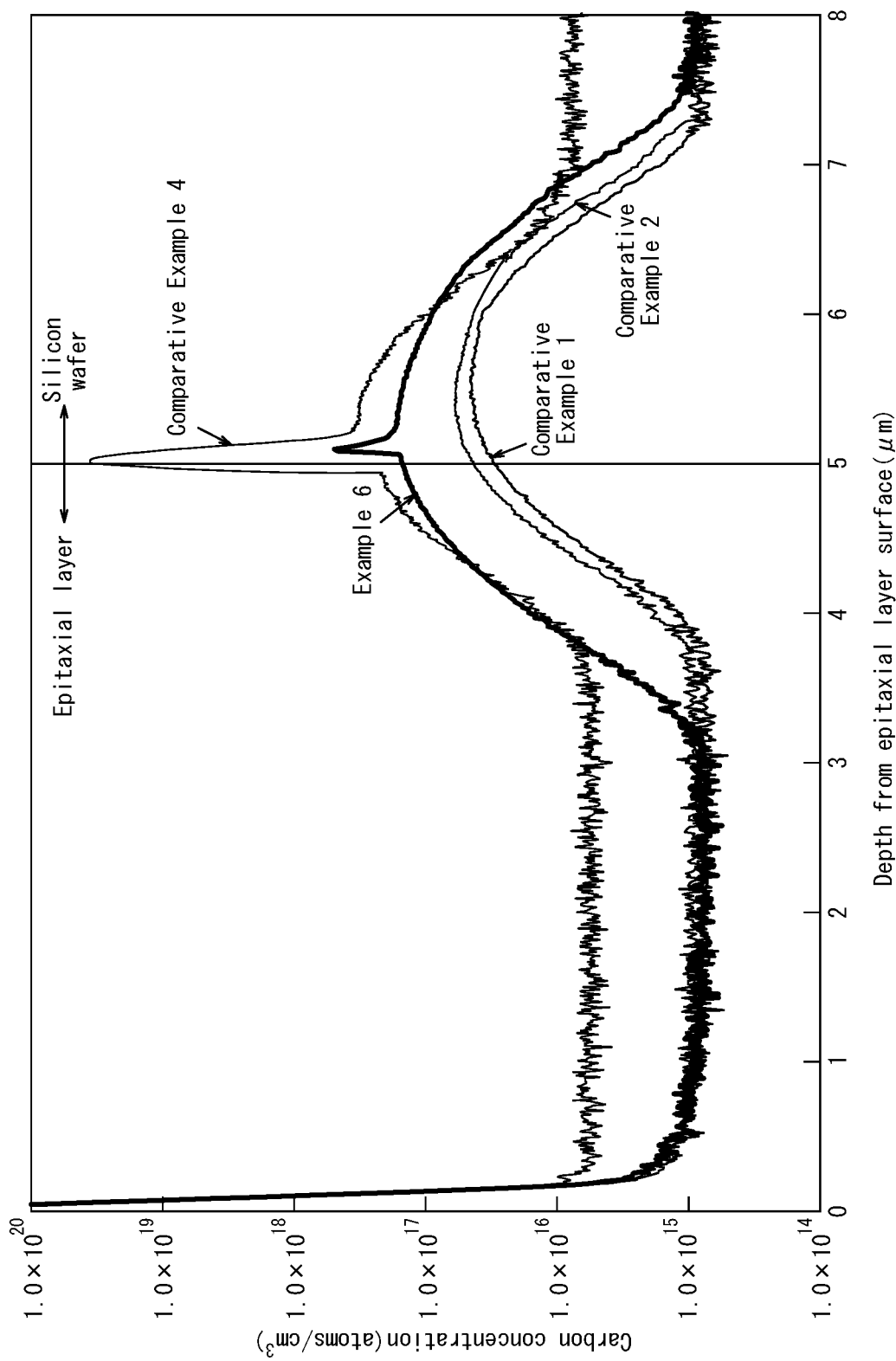
FIG. 5 is a graph illustrating the carbon concentration profile after the formation of an epitaxial layer in Example 6 and Comparative Examples 1, 2, and 4, found by SIMS.

In this embodiment, for example, as in Example 6 illustrated in FIG. 5, the SIMS carbon concentration profile in the depth direction of the silicon epitaxial layer and the modified layer has a broad first peak over the silicon epitaxial layer and the modified layer and a sharp second peak that projects from the first peak and lies at a position in the modified layer near the interface between the modified layer and the epitaxial layer. In this embodiment, despite a small amount of implanted carbon, the carbon concentration profile has such a sharp second peak. This makes it possible to achieve sufficient getting capability. The peak concentration of the second sharp peak in the carbon concentration profile is preferably $2.0 \times 10^{17}$ atoms/cm$^3$ or more, more preferably $3.0 \times 10^{17}$ atoms/cm$^3$ or more, and preferably $1.0 \times 10^{18}$ atoms/cm$^3$ or less.

Figure 6:
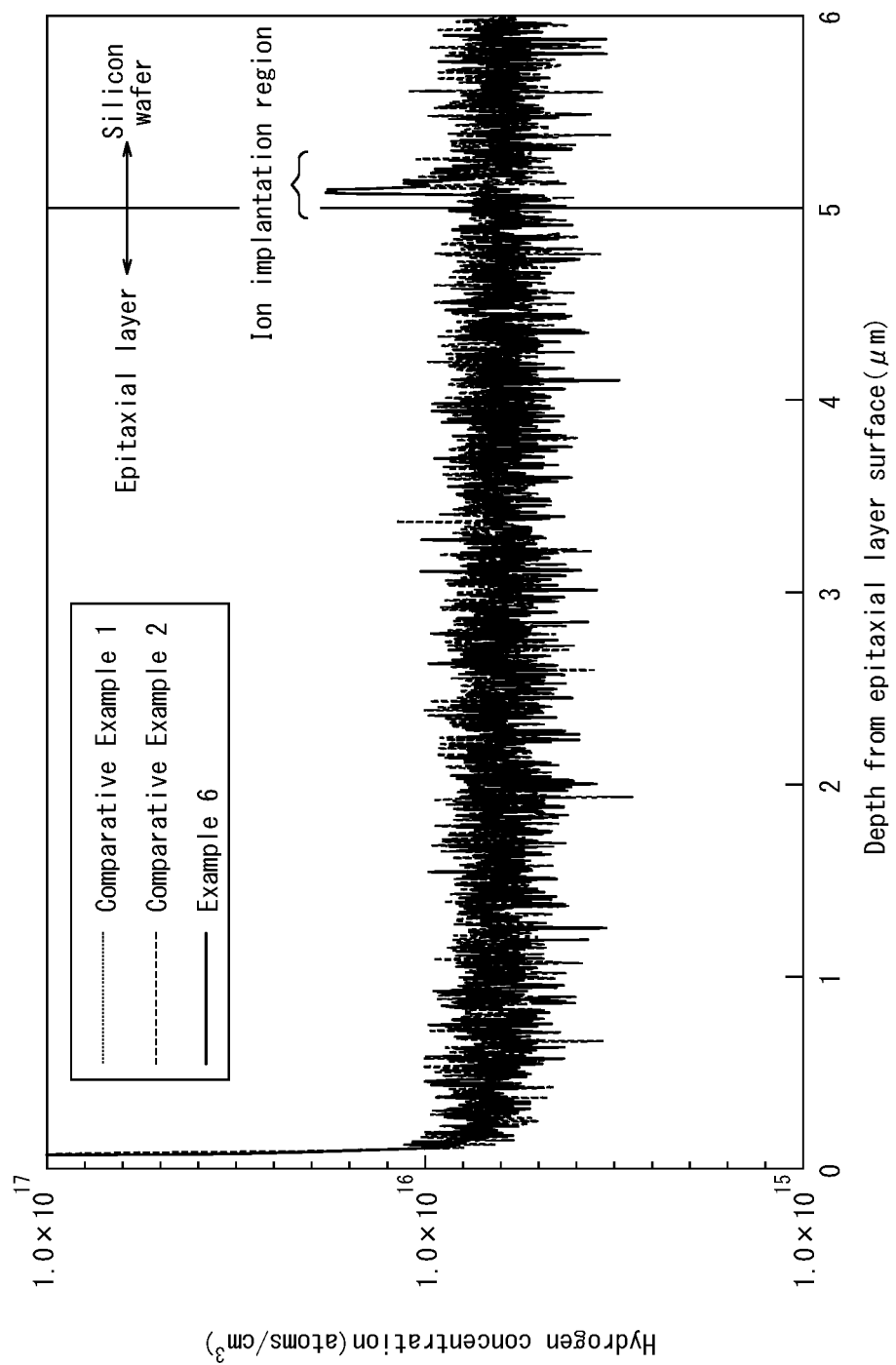
FIG. 6 is a graph illustrating the hydrogen concentration profile after the formation of an epitaxial layer in Example 6 and Comparative Examples 1 and 2, found by SIMS.

For example, as in Example 6 illustrated in FIG. 6, the SIMS hydrogen concentration profile in the depth direction of the modified layer has a peak with a peak concentration of $1.0 \times 10^{16}$ atoms/cm$^3$ or more in the modified layer (at a position near the interface with the epitaxial layer). Hydrogen remaining in the modified layer is diffused into the epitaxial layer by heat treatment performed in the device formation process for forming a semiconductor device in the epitaxial layer, and is expected to passivate defects in the epitaxial layer. In this embodiment, the hydrogen peak concentration is approximately $1.0 \times 10^{17}$ atoms/cm$^3$ or less.

[Cross-Sectional TEM Image]

In the defect analysis using a cross-sectional TEM image of the modified layer in the epitaxial silicon wafer 100, a defect region in which EOR defects having a maximum width of 50 nm to 250 nm are present at a density of $5.0 \times 10^7$/cm$^2$ or more is observed. These defects are conjectured to be defects caused by the implantation of SiH$_x$ ions. Accordingly, since this disclosure has the above feature, sufficient getting capability can be achieved despite the small amount of implanted carbon. Note that "EOR (end of range) defects" herein collectively refers to defects in the forms such as stacking faults in the {111} direction, dislocation loops, and {311} defects that are formed when atoms expelled from crystal lattices by the elements introduced by ion implantation (i.e. silicon atoms in the silicon wafer in this disclosure) aggregate at a position deeper than the implantation range (i.e. a deeper position than the peak position in the SIMS carbon concentration profile) due to heat treatment. The "maximum width" of the EOR defects means the maximum width of the EOR defects in the TEM image as given in FIG. 8. Whereas when the carbon dose is high, black spot defects caused due to implanted carbon are formed at positions shallower than the implantation range; since the amount of carbon implanted is small in this disclosure, no black spot defects caused due to implanted carbon are not visually observed in the cross-sectional TEM image. Further, in this embodiment, the density of the EOR defects is approximately $1.0 \times 10^{15}$/cm$^2$ or less. Further, "cross-sectional TEM image" herein refers to an image obtained by cleaving the epitaxial silicon wafer 100 in the thickness direction and observing the cleaved cross section of the modified layer using TEM. Further, in this disclosure, the "EOR defect density" is determined as follows. As is apparent from the TEM image of Example 6 in FIG. 7, in this disclosure, EOR defects are densely formed at almost the same depth positions (specifically, positions slightly deeper than the carbon concentration peak position found by SIMS measurement). Accordingly, a TEM test sample is cut from around the depth position of the carbon concentration peak observed in SIMS measurement, to include the region where the EOR defects are formed; and the test sample is observed by TEM. Further, as given in FIG. 7, a density calculation area (that is, the defect region) is defined as a region that has a length of 300 nm in the vertical (depth) direction and includes the EOR defects; the number of defects having a maximum width of 50 nm to 250 nm, observed in the area is counted; and the number of defects is divided by the area of the density calculation area, thereby determining the EOR defect density (number/cm$^2$). Note that although the density calculation area is a region that ranges 300 nm in the vertical direction and 3 µm in the lateral direction in the example in FIG. 7, the length in the lateral direction is not limited.

(Method of Producing Semiconductor Device)

The method of producing a semiconductor device, according to one embodiment of this disclosure includes the steps of the above-described method of producing the epitaxial silicon wafer 100 and a step of forming a semiconductor device on the silicon epitaxial layer 16. Further, the method of producing a semiconductor device, according to another embodiment of this disclosure includes a step of forming a semiconductor device on the silicon epitaxial layer 16 of the above-described epitaxial silicon wafer 100. These production methods can secure sufficient getting capability and inhibit the formation of point defects caused due to carbon, in the device formation region in the epitaxial layer.

Examples of the semiconductor device formed in the silicon epitaxial layer 16 include, but not limited to, MOSFETs, DRAMs, power transistors, and back-illuminated solid-state image sensing devices.

EXAMPLES

[Preparation of Silicon Wafer]

An n-type silicon wafer obtained from a CZ single crystal silicon ingot (diameter: 300 mm, thickness: 775 µm dopant: phosphorus, resistivity: 10 Ω·cm) was prepared for each experiment.

[Cluster Ion Irradiation]

As given in Table 2, ten experiments (Examples 1 to 6 and Comparative Examples 1 to 4) were performed under different cluster ion irradiation conditions.

Examples 1 to 6 and Comparative Examples 1 and 2

Figure 2:
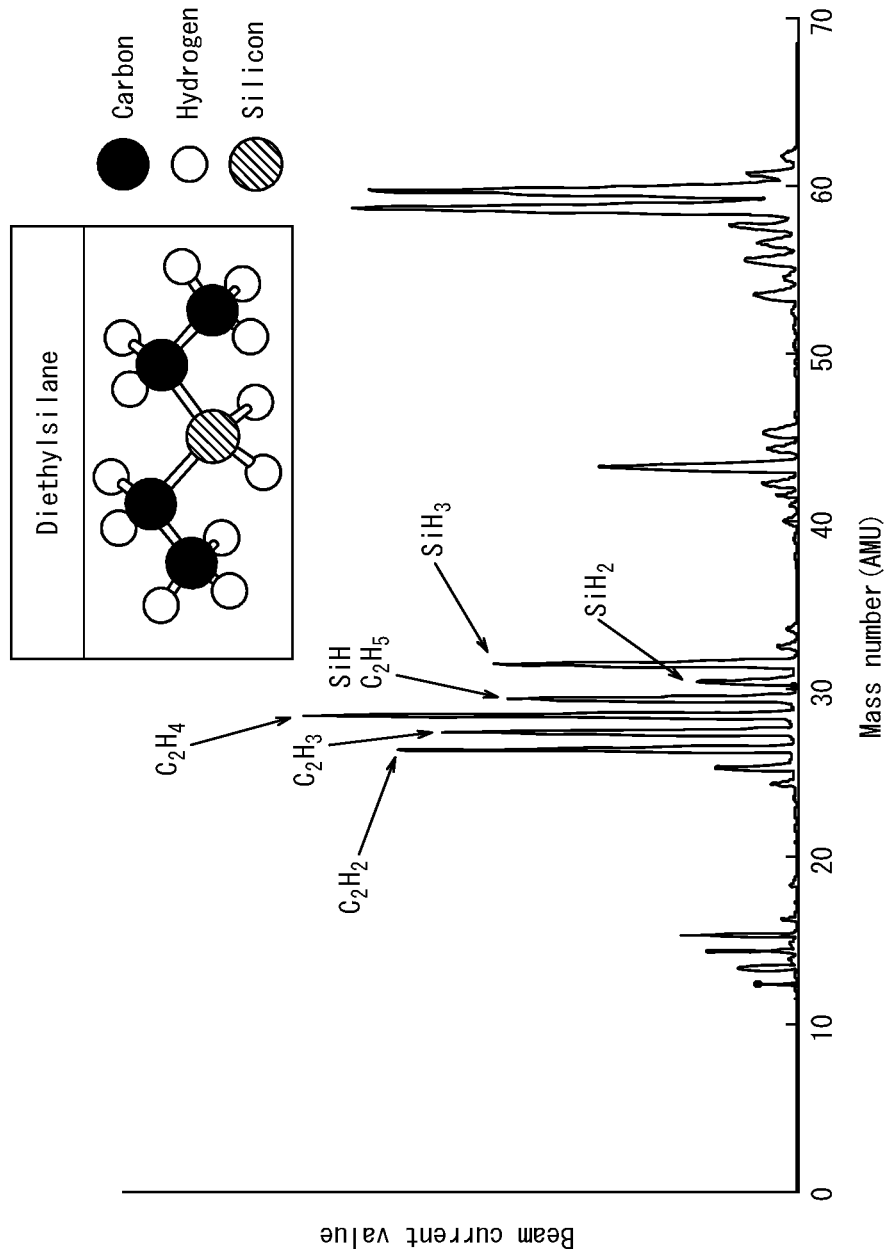
FIG. 2 is a graph (mass spectrum) depicting the mass fragmentation of the cluster ions obtained from diethylsilane ($SiC_4H_{12}$) as a source gas.

In Examples 1 to 6 and Comparative Examples 1 and 2, diethylsilane (SiC$_4$H$_{12}$) was used as a source gas. FIG. 2 presents the mass spectrum of diethylsilane. Further, the ion species corresponding to a mass number of 26 to 31 in the mass spectrum presented in FIG. 2 are given in Table 1. The peak of the mass number 31 corresponds to SiH$_3$ ions. The relatively low peak of the mass number 30 corresponds to SiH$_2$ ions. The peak of the mass number 29 corresponds to C$_2$H$_5$ ions. The peaks of the mass number 28, the mass number 27, and the mass number 26 correspond to C$_2$H$_4$ ions, C$_2$H$_3$ ions, and C$_2$H$_2$ ions, respectively. In this example, ion species having a mass number in the range of 29 to 31 were extracted from the ion species corresponding to the mass spectrum given in FIG. 2 to obtain a cluster ion beam using a cluster ion generating apparatus (CLARIS produced by Nissin Ion Equipment Co., Ltd.; CLARIS is a registered trademark in Japan, other countries, or both), and the cluster ion beam was shot on a surface of a silicon wafer at an acceleration voltage of 80 keV/ion. This cluster ion beam contained SiH$_3$ ions mainly, a trace amount of SiH$_2$ ions, and SiH ions as SiH$_x$ ions; and contained C$_2$H$_5$ ions as C$_2$H$_y$ ions. In the above cluster ion generating apparatus, total dose of all the ion species can be set; thus, in Examples 1 to 6 and Comparative Examples 1 and 2, the total dose given in Table 2 was used as a system setting value.

TABLE 1

| Mass number | SiH$_x$ | C$_2$H$_y$ |
|---|---|---|
| 31 | SiH$_3$ | — |
| 30 | SiH$_2$ | — |
| 29 | SiH | C$_2$H$_5$ |
| 28 | — | C$_2$H$_4$ |
| 27 | — | C$_2$H$_3$ |
| 26 | — | C$_2$H$_2$ |

Figure 3:
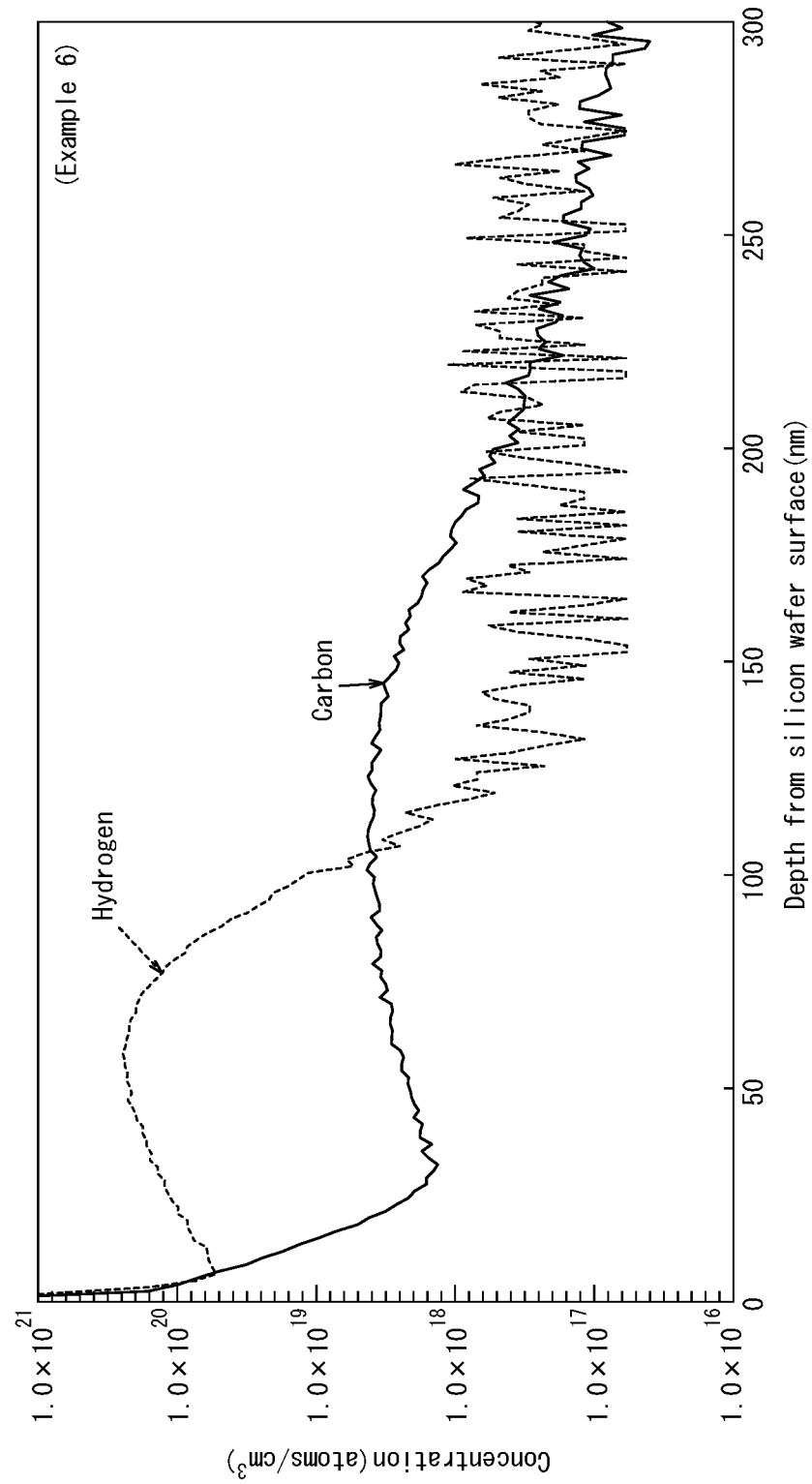
FIG. 3 is a graph of the concentration profiles of carbon and hydrogen after ion implantation before the formation of an epitaxial layer in Example 6, found by SIMS.

In Examples 1 to 6 and Comparative Examples 1 and 2, the dose of C$_2$H$_5$ ions and the dose of SiH$_x$ ions were determined as follows. First, for the silicon wafer after cluster ion irradiation (before epitaxial growth), the concentration profiles of carbon and hydrogen in the depth direction from the surface of the silicon wafer were found by SIMS measurement. The concentration profiles in Example 6 are representatively given in FIG. 3. In FIG. 3, the hydrogen concentration profile is higher than the background in an area of approximately 150 nm from the surface of the silicon wafer, and the carbon concentration is higher than the background in an area of approximately 300 nm from the surface of the silicon wafer. Accordingly, in Example 6, a surface layer portion of approximately 300 nm in the silicon wafer was defined as a modified layer. The amount of carbon implanted into the modified layer was determined by integrating the carbon concentration profile in the range from 30 nm to 300 nm on the horizontal axis. The amount of implanted carbon was determined in the same manner in Examples 1 to 5 and Comparative Examples 1 and 2. The results are given in Table 2.

Since the number of carbon atoms in an C$_2$H$_y$ ion is 2, the value obtained by dividing the amount of implanted carbon found above by 2 is given as "the dose of C$_2$H$_y$ ions" in Table 2. Further, the "dose of SiH$_x$ ions" found by subtracting the dose of C$_2$H$_y$ ions from the total dose is also given in Table 2. Now, the relationship between the total dose and the amount of implanted carbon, found in Examples 1 to 6 and Comparative Examples 1 and 2 is given in FIG. 4. As given in FIG. 4, in Comparative Example 1 and Example 6, the amount of implanted carbon was 10% of the total dose; in Comparative Example 2 and Examples 1 to 3 and 5, the amount of implanted carbon was 7% of the total dose; and in Example 4, the amount of implanted carbon was 4% of the total dose.

Comparative Examples 3 and 4

In Comparative Examples 3 and 4, C$_3$H$_5$ cluster ions were generated using cyclohexane as a source gas and extracted, and were shot on a surface of the silicon wafer at an acceleration voltage of 80 keV/ion. The dose of C$_3$H$_5$ cluster ions is given in the "Total dose" column of Table 2. In Comparative Example 3, the dose was set so that the amount of carbon would be the same as that in Example 6; in Comparative Example 4, the dose was set so that the amount of carbon would be ten times that in Example 6. Also in Comparative Examples 3 and 4, the amount of implanted carbon was found from the carbon concentration profile after cluster ion irradiation as in Examples 1 to 6 and Comparative Examples 1 and 2, and is given in Table 2.

[Epitaxial Growth]

Subsequently, the silicon wafer having been irradiated with the cluster ions was transferred into a single-wafer processing epitaxial growth apparatus (produced by Applied Materials, Inc.) and subjected to hydrogen baking at a temperature of 1120° C. for 30 s in the apparatus using hydrogen as a carrier gas, and trichlorosilane as a source gas, followed by CVD at 1120° C., thereby epitaxially growing a silicon epitaxial layer (thickness: 5 µm, dopant: phosphorus, resistivity: 10 Ω·cm) on the surface of the silicon wafer, where the modified layer was formed. Thus, an epitaxial silicon wafer was obtained.

[SIMS Analysis]

For the epitaxial silicon wafers of Examples 1 to 6 and Comparative Examples 1 to 4, the concentration profiles of carbon and hydrogen in the depth direction from the surface of the silicon epitaxial layer were found by SIMS measurement. Of them, the carbon concentration profiles in Example 6 and Comparative Examples 1, 2, and 4 are given in FIG. 5; and the hydrogen concentration profiles in Example 6 and Comparative Examples 1 and 2 are given in FIG. 6.

Referring to FIG. 5, in Example 6, in an area of approximately 2.5 µm in a surface layer portion of the silicon wafer (that is, approximately 2.5 µm from the interface between the silicon epitaxial layer and the silicon wafer), the carbon concentration was higher than the background. Referring to FIG. 6, in Example 6, in a very small area of approximately 0.3 µm in the surface layer portion of the silicon wafer, the hydrogen concentration was higher than the background. Thus, in Example 6, a surface layer portion of approximately 2.5 µm in the silicon wafer was defined as a modified layer. The reason that the area where the carbon concentration was higher than the background became larger than that before epitaxial growth is presumably that the implanted carbon would have diffused in the depth direction from the surface of the silicon wafer with the epitaxial growth. Further, FIG. 5 demonstrates that carbon also diffused into the epitaxial layer with the epitaxial growth. Further, the amount of carbon distributed in the silicon epitaxial layer and the modified layer was found as the amount of carbon determined by integrating the carbon concentration profile in the area where the carbon concentration was higher than the background under each set of conditions (in Example 6, the area corresponding to 3.0 µm to 7.5 µm on the horizontal axis in FIG. 5) and is given in the "Amount of diffused carbon after epitaxial growth" column in Table 2.

As is apparent from FIG. 5, in each of Example 6 and Comparative Examples 1, 2, and 4, the carbon concentration profile has a broad first peak over the silicon epitaxial layer and the modified layer. Further, in Example 6 and Comparative Example 4, a sharp second peak appeared at a position in the modified layer near the interface between the modified layer and the epitaxial layer, projecting from the broad first peak. Table 2 presents the presence or absence of the second peak of carbon and its peak concentration. In Comparative Example 4, it is likely that since the amount of implanted carbon was large, such a sharp appeared. However, in Example 6, despite a small amount of carbon implanted, such a sharp peak appeared. Such a sharp peak appeared in Example 6 presumably due to the effect of implanting SiH$_x$ ions.

As can be clearly seen from FIG. 6, in Example 6, the hydrogen concentration profile had a peak with a peak concentration of 1.0×10$^{16}$ atoms/cm$^3$ or more at a position in the modified layer near the interface between the modified layer and the epitaxial layer. Although not illustrated in FIG. 6, this was the same for Comparative Example 4. On the other hand, in Comparative Examples 1 and 2, such a peak did not appear. In Comparative Example 4, since the amount of carbon implanted was large, carbon was localized to that position, and hydrogen is likely to have been trapped there. However, in Example 6, despite a small amount of carbon implanted, such a peak appeared. Such a peak appeared in Example 6 presumably due to the effect of implanting $SiH_x$ ions.

Further, also for Examples 1 to 5, a carbon concentration profile and a hydrogen concentration profile the same as those in Example 6 were found, and Table 2 gives the peak concentration of the second peak, the amount of diffused carbon after epitaxial growth, and the presence or absence of a hydrogen peak. Also for Comparative Example 3, Table 2 gives the peak concentration of the second peak, the amount of diffused carbon after epitaxial growth, and the presence or absence of a hydrogen peak.

[Cross-Sectional TEM Observation]

Figure 7:
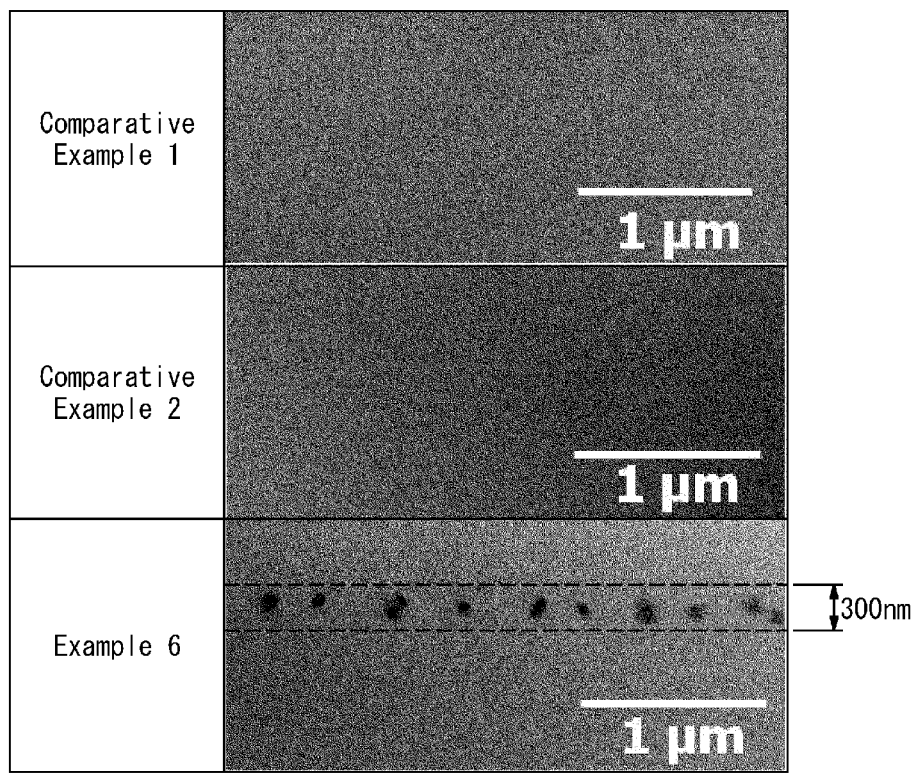
FIG. 7 presents cross-sectional TEM images (magnification: 200,000×) of the respective modified layers in Example 6 and Comparative Examples 1 and 2.
Figure 8:
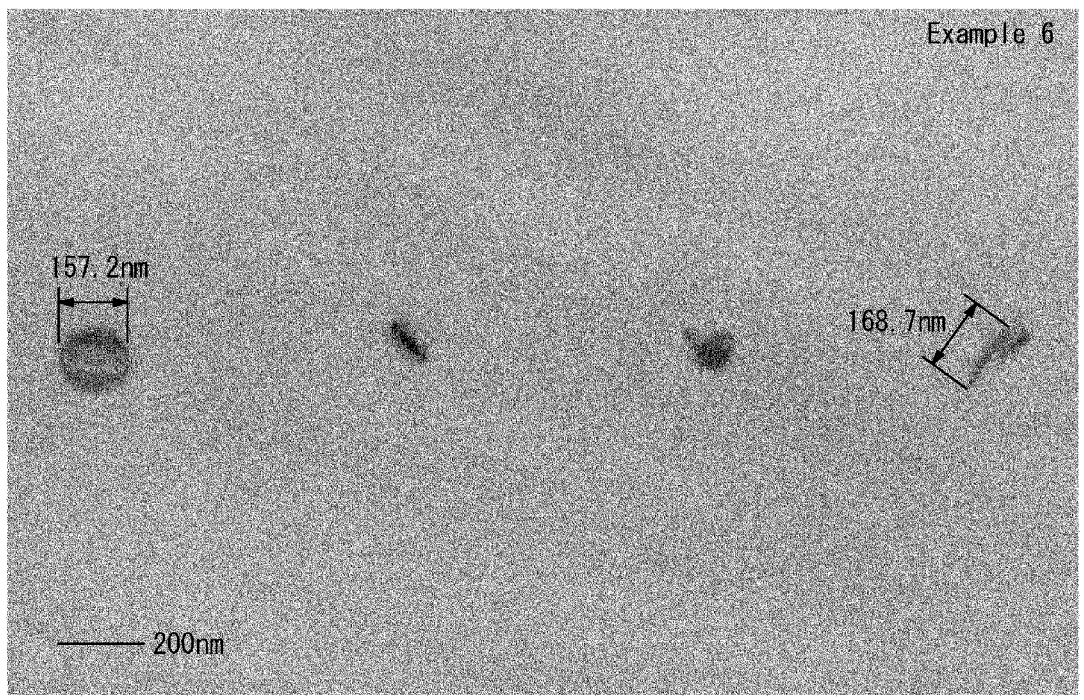
FIG. 8 presents a cross-sectional TEM image (magnification: 1,000,000×) of the modified layer in Example 6.

A cross section of the modified layer in the epitaxial wafer (near the interface with the epitaxial layer) in each of Examples 1 to 6 and Comparative Examples 1 to 4 was observed using TEM. TEM images obtained for Example 6 and Comparative Examples 1 and 2 are representatively given in FIG. 7, and FIG. 8 presents a TEM image of a field of view for Example 6, different from that in FIG. 7. In Example 6, EOR defects having a maximum width of 50 nm to 250 nm were observed. This was the same for Examples 1 to 5. These defects are conjectured to be defects caused by the implantation of $SiH_x$ ions. Further, in the TEM image (not shown) of Comparative Example 4, black spot defects having a diameter of approximately 5 nm were observed at a position shallower than the implantation range. Since the amount of carbon implanted in Comparative Example 4 was large, those defects are likely to have been defects caused due to the implanted carbon. Table 2 presents the presence or absence of black spot defects and the EOR defect density in Examples 1 to 6 and Comparative Examples 1 to 4.

[SIMS Profile and Consideration Based on Cross-Sectional TEM Observation]

Considering the SIMS profile and the cross-sectional TEM observation, the following phenomenon is conjectured to have occurred in Examples 1 to 6. Relatively large implantation defects were formed in the modified layer near the interface between the modified layer and the epitaxial layer due to the implantation of $SiH_x$ ions. Presumably, the implanted carbon derived from $C_2H_5$ ions aggregated in the implantation defects and hydrogen was also trapped there, thus an EOR defect region that could have high getting capability was formed.

[Evaluation of the Amount of Diffused Carbon after Epitaxial Growth]

For Examples 1 to 6 and Comparative Examples 1 to 4, the amount of carbon diffused from the modified layer to the epitaxial layer with epitaxial growth was determined by integrating the carbon concentration profile from 4.0 μm to 4.9 μm as in FIG. 5. The results are given in Table 2. As can be clearly seen from Table 2, in Examples 1 to 6, the amount of implanted carbon was made smaller than that in Comparative Example 4, thus the amount of carbon diffused was also reduced more than in Comparative Example 4.

[Evaluation of Amount of Diffused Carbon after Simulated Device Heat Treatment]

In Examples 1 to 6 and Comparative Examples 1 to 4, after heat treatment was performed under simulated device heat treatment conditions (1050° C., 2.5 h, nitrogen gas atmosphere), the carbon concentration profile from 0.2 μm to 4.9 μm was integrated, thus the amount of carbon diffused from the modified layer to the epitaxial layer with simulated device heat treatment. The results are given in Table 2. As can be clearly seen from Table 2, in Examples 1 to 6, the amount of implanted carbon was made smaller than that in Comparative Example 4, thus the amount of carbon diffused was also reduced more than in Comparative Example 4.

[Evaluation of Getting Capability]

In Examples 1 to 6 and Comparative Examples 1 to 4, the surface of the epitaxial layer of the epitaxial silicon wafer was forcibly contaminated by spin-on contamination using a Ni contaminant solution, and then heat treatment was performed at 900° C. for 60 min in a nitrogen gas atmosphere. After that, SIMS measurement was performed on each epitaxial wafer to find the Ni concentration profile in the depth direction of the wafer, thereby determining the peak area. As the peak area is large, more Ni can be trapped, thus the getting capability can be rated high. In this connection, the peak area was given as the amount of trapped Ni in Table 2. Further, a similar test was performed using a Cu contaminant solution, and the amount of trapped Cu was determined in a similar manner and is given in Table 2.

As can be clearly seen from Table 2, in Example 6, high getting capability comparable to that in Comparative Example 4 where the amount of implanted carbon was ten times that in Example was obtained. Also in Examples 1 to 5, high getting capability was obtained.

TABLE 2

| Classification | Cluster ion irradiation conditions | | | | | | TEM observation | | SIMS analysis Presence of carbon second peak |
|---|---|---|---|---|---|---|---|---|---|
| | Source gas | Ion species | Total dose (ions/cm$^2$) | Amount of implanted carbon (atoms/cm$^2$) | $C_2H_5$ dose (ions/cm$^2$) | SiH$x$ dose (ions/cm$^2$) | Presence of black spot defects | EOR defect density (cm$^{-2}$) | and peak concentration (atoms/cm$^3$) |
| Comparative Example 1 | SiC$_4$H$_{12}$ | SiH$_3$ SiH$_2$ | 5.00E+13 | 5.00E+12 | 2.50E+12 | 4.75E+13 | Absent | 0 | Absent |
| Comparative Example 2 | | SiH C$_2$H$_3$ | 1.00E+14 | 7.00E+12 | 3.50E+12 | 9.65E+13 | Absent | 0 | Absent |
| Example 1 | | | 2.00E+14 | 1.40E+13 | 7.00E+12 | 1.93E+14 | Absent | 7.00E+07 | 4.00E+16 |
| Example 2 | | | 3.00E+14 | 2.10E+13 | 1.05E+13 | 2.90E+14 | Absent | 1.10E+08 | 6.00E+16 |
| Example 3 | | | 4.00E+14 | 2.80E+13 | 1.40E+13 | 3.86E+14 | Absent | 5.00E+08 | 1.00E+17 |
| Example 4 | | | 5.00E+14 | 2.00E+13 | 1.00E+13 | 4.90E+14 | Absent | 1.00E+09 | 4.00E+16 |
| Example 5 | | | 5.00E+14 | 3.502+13 | 1.75E+13 | 4.83E+14 | Absent | 1.10E+09 | 1.40E+17 |
| Example 6 | | | 5.00E+14 | 5.00E+13 | 2.50E+13 | 4.75E+14 | Absent | 1.20E+09 | 5.00E+17 |
| Comparative Example 3 | C$_6$H$_{12}$ | C$_3$H$_3$ | 1.70E+13 | 5.00E+13 | — | — | Absent | 0 | Absent |

TABLE 2-continued

| Classification | (first col) | (second col) | | | | | |
|---|---|---|---|---|---|---|---|
| Comparative Example 4 | 1.70E+14 | 5.00E+14 | — | — | Present | 0 | 3.50E+19 |

| | SIMS analysis | | Amount of diffused carbon after epitaxial growth (atoms/cm$^2$) | Amount of diffused carbon after simulated device heat treatment (atoms/cm$^2$) | Gettering capability | |
|---|---|---|---|---|---|---|
| Classification | Amount of carbon after epi (atoms/cm$^2$) | Presence of hydrogen peak | | | Amount of trapped Ni (atoms/cm$^2$) | Amount of trapped Cu (atoms/cm$^2$) |
| Comparative Example 1 | 2.00E+12 | Absent | 4.00E+11 | 5.00E+11 | 0 | 0 |
| Comparative Example 2 | 3.00E+12 | Absent | 7.00E+11 | 1.00E+12 | 0 | 0 |
| Example 1 | 4.00E+12 | Present | 1.00E+12 | 2.00E+12 | 6.50E+12 | 8.00E+10 |
| Example 2 | 6.00E+12 | Present | 2.00E+12 | 3.00E+12 | 1.10E+13 | 9.00E+10 |
| Example 3 | 7.00E+12 | Present | 3.00E+12 | 4.00E+12 | 1.20E+13 | 4.30E+11 |
| Example 4 | 6.50E+12 | Present | 2.50E+12 | 3.50E+12 | 1.50E+13 | 1.00E+13 |
| Example 5 | 1.00E+13 | Present | 4.00E+12 | 5.002+12 | 1.70E+13 | 9.90E+12 |
| Example 6 | 1.50E+13 | Present | 6.00E+12 | 7.00E+12 | 1.60E+13 | 9.70E+12 |
| Comparative Example 3 | 3.00E+13 | Absent | 6.00E+12 | 8.00E+12 | 0 | 0 |
| Comparative Example 4 | 3.40E+14 | Present | 8.00E+12 | 1.70E+13 | 1.50E+13 | 9.80E+12 |

INDUSTRIAL APPLICABILITY

The method of producing an epitaxial silicon wafer, according to this disclosure produces an epitaxial silicon wafer in which sufficient getting capability is secured and the diffusion of carbon into an epitaxial layer is inhibited during the epitaxial growth and during the device formation process.

REFERENCE SIGNS LIST

100: Epitaxial silicon wafer
10: Silicon wafer
10A: Surface of silicon wafer
12: Cluster ion
12A: SiH$_x$ ion
12B: C$_2$H$_y$ ion
14: Modified layer
16: Silicon epitaxial layer

The invention claimed is:

1. A method of producing an epitaxial silicon wafer, the method comprising:
 a step of irradiating a surface of a silicon wafer with a cluster ion beam including SiH$_x$ ions and C$_2$H$_y$ ions to form a modified layer that is located in a surface layer portion of the silicon wafer and that contains a solid solution of constituent elements of the cluster ion beam, where at least one of the integers 1 to 3 is selected as x of the SiH$_x$ ions, and at least one of the integers 2 to 5 is selected as y of the C$_2$H$_y$ ions; and
 a step of forming a silicon epitaxial layer on the modified layer of the silicon wafer,
 wherein a dose of the SiH$_x$ ions is 1.5×10$^{14}$ ions/cm$^2$ or more.

2. The method of producing an epitaxial silicon wafer, according to claim 1, wherein a dose of the C$_2$H$_y$ ions is 1.0×10$^{14}$ ions/cm$^2$ or less.

3. The method of producing an epitaxial silicon wafer, according to claim 1, wherein a source gas of the cluster ion beam is diethylsilane.

4. The method of producing an epitaxial silicon wafer, according to claim 1, wherein for the cluster ion beam, each of 1, 2, and 3 is selected as x of the SiH$_x$ ions, and 5 is selected as y of the C$_2$H$_y$ ions.

5. The method of producing an epitaxial silicon wafer, according to claim 1, wherein a thickness of the silicon epitaxial layer is 4 μm or less.

6. An epitaxial silicon wafer comprising:
 a silicon wafer;
 a modified layer that is located in a surface layer portion of the silicon wafer and that contains a solid solution of at least one of carbon and hydrogen; and
 a silicon epitaxial layer formed on the modified layer,
 wherein in a defect analysis using a cross-sectional TEM image of the modified layer, a defect region in which EOR defects having a maximum width of 50 nm to 250 nm are present at a density of 5.0×10$^7$/cm$^2$ or more is observed,
 an amount of carbon distributed in the silicon epitaxial layer and the modified layer is 2.0×10$^{14}$ atoms/cm$^2$ or less, and
 in a hydrogen concentration profile in a depth direction of the modified layer, found by SIMS, a peak concentration is 1.0×10$^{16}$ atoms/cm$^3$ or more.

7. A method of producing a semiconductor device, the method comprising: the steps of the method of producing an epitaxial silicon wafer, according to claim 1; and
 a step of forming a semiconductor device in the silicon epitaxial layer of the epitaxial silicon wafer.

8. The method of producing a semiconductor device, the method comprising a step of forming a semiconductor device in the silicon epitaxial layer of the epitaxial silicon wafer according to claim 6.

* * * * *